(12) United States Patent
Han et al.

(10) Patent No.: US 11,661,647 B2
(45) Date of Patent: May 30, 2023

(54) INTEGRATED SURFACE TREATMENTS AND COATINGS FOR ARTIFICIAL LIFT PUMP COMPONENTS

(71) Applicant: SCHLUMBERGER TECHNOLOGY CORPORATION, Sugar Land, TX (US)

(72) Inventors: Bing Han, Katy, TX (US); Manuel Marya, Rosharon, TX (US); Yuteng Liang, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 760 days.

(21) Appl. No.: 16/566,423

(22) Filed: Sep. 10, 2019

(65) Prior Publication Data
US 2021/0071306 A1 Mar. 11, 2021

(51) Int. Cl.
| | |
|---|---|
| *C23C 8/22* | (2006.01) |
| *C23C 16/50* | (2006.01) |
| *C23C 14/06* | (2006.01) |
| *E21B 43/12* | (2006.01) |
| *C23C 8/32* | (2006.01) |
| *C23C 8/08* | (2006.01) |
| *C23C 16/26* | (2006.01) |
| *C23C 28/04* | (2006.01) |

(52) U.S. Cl.
CPC ............... *C23C 8/22* (2013.01); *C23C 8/08* (2013.01); *C23C 8/32* (2013.01); *C23C 14/0605* (2013.01); *C23C 16/26* (2013.01); *C23C 16/50* (2013.01); *C23C 28/044* (2013.01); *C23C 28/046* (2013.01); *E21B 43/126* (2013.01)

(58) Field of Classification Search
CPC .... C23C 8/22; C23C 8/08; C23C 8/32; C23C 14/0605; C23C 16/26; C23C 16/50; C23C 28/044; C23C 28/046; C23C 8/26; C23C 8/50; C23C 8/70; C23C 8/76; C23C 14/0647; C23C 16/342; C23C 16/36; C23C 16/45523; C23C 28/048; E21B 43/126

See application file for complete search history.

(56) References Cited

U.S. PATENT DOCUMENTS

| | | | |
|---|---|---|---|
| 9,617,654 | B2 | 4/2017 | Rajagopalan et al. |
| 2014/0178637 | A1* | 6/2014 | Rajagopalan ....... C23C 14/0605 427/249.7 |
| 2015/0354287 | A1 | 12/2015 | Nielsen et al. |
| 2018/0266190 | A1 | 9/2018 | Nielsen, Jr. et al. |

\* cited by examiner

*Primary Examiner* — Jacob M Amick
*Assistant Examiner* — Charles J Brauch
(74) *Attorney, Agent, or Firm* — Jeffrey D. Frantz

(57) ABSTRACT

Artificial lift pump components such as couplings are disclosed, all having a body formed from a selected material, the body having an inner diameter and an outer diameter, a first surface treatment introducing carbon, nitrogen, boron into the material to form a first and hard layer, and a second layer defined as an deposited coating to the first layer that is also made of a carbon, nitrogen, or boron and is further characterized as being ceramic like (hard) and having a low-friction.

9 Claims, 5 Drawing Sheets

INTEGRATED SURFACE TREATMENTS AND COATINGS FOR ARTIFICIAL LIFT PUMP COMPONENTS

FIELD OF THE DISCLOSURE

Aspects of the disclosure relate to hydrocarbon pumping systems, and more specifically to surface treatments combined with coatings to both change the component surface chemistry and add onto with end results being component and pump life span extensions achieved by friction reduction and wear enhancement, among others.

BACKGROUND INFORMATION

Production from hydrocarbon wells can be enhanced by artificial-lift, specifically the use of mechanical devices such as such sucker rod pumps, progressive cavity pumps, electric submersible pumps, or gas lift valves. In all cases, corrosion, wear, and fatigue act to shorten the life span of artificial lift components, either alone or in combination. In some instances, as with reciprocating or rotating friction, lubrication in between surfaces drives efficiency and reliability. Increasing lubrication using ultra-low friction surfaces, as typically made possible with self-lubricative coatings and materials can lead to huge wear reduction, consequently significant increase in reliability and equipment life span.

Sucker rod pumping systems are a widely used type of artificial lift for hydrocarbon oil wells. Sucker rod pumping systems consist of a surface pumping unit which converts the rotating horsepower of the electrical motors or engine to linear reciprocal motion just above the well head and a pumping unit which lifts the fluid out of the wellbore to the surface. The sucker rod transmits reciprocating power to a downhole pump and is the connecting link between the surface pumping unit and the downhole pump. The steel rod is typically 25 to 30 feet in length, and it is connected to other components by couplings. Sucker rod pump systems are plentiful, and studies have been conducted to determine the most common failure mechanisms of such systems. The studies indicate that half of the failures in sucker rod systems in deviated shale wells is related to either tubing or sucker rod coupling failures, primarily resulting from wear damage. Fatigue of coupling has also been reported, as is the corrosion. In all cases, better materials, or materials enhanced with specific surface treatments, coatings, or both can help improve field performance of pumping systems.

Conventionally, there are two current types of couplings in the market to combat the somewhat unpredictable wear issue in suck rod pump systems, A first type of coupling relies of a variety of coatings, among which are the nickel and chrome family of platings, but also more advanced coatings such as of the plasma-spray family or diamond like carbon coatings (DLC). These coatings inherently increase part dimensions where applied, therefore typically requires the component dimensions to be corrected and account for their added thickness, especially when significant. Differently, a second type of coupling relies on monolithic materials. One such example is a ternary Cu—Ni—Sn alloy of copper referred as ToughMet™, falling under the international designation of SINS C72900, This material is well-known for its highly self-lubricative properties combined, uniquely combined with high strength and satisfactory corrosion resistance for a large part of the sucker rod market. Each of these different types of couplings are currently in use. The monolithic and advanced coating technology coatings, such as diamond like carbon coatings, are not widespread yet despite offering low friction, among other properties that promote pump efficiency and performance improvements. They are relatively high cost, a factor that contributes to their limited market penetration so far.

As provided in FIG. 1, to improve pump system performance, advanced steel couplings with diamond like carbon coating on their external surface have been applied. The diamond like carbon coating surface is advantageously ultra hard, thus wear resistant, but by also offering ultra-low friction can reduce steel casing wear, thus increase pump system life span. Steel couplings with DLC coatings, even as thin as approximately 2 to 8 micron-meters is capable of outperforming standard (non-coated) units. In some embodiments, multilayer DLC coating can be used. With thickness of a coating often seen as a proportional multiplicator of wear resistance, the life of the coating and pumping system may be increased with thick and highly adherent coating. However, such multi-layered DLC coatings are extremely difficult to implement because of high costs associated to extended process time and special process requirements, to which may be added challenges to control coating internal stresses and layer adhesion. Achieving a thick layer diamond like carbon coating on a steel coupling, either with multi layered diamond like carbon coatings or thick single layer diamond like carbon coating is theoretically beneficial to offer life extension but so far turns out to be impractical. In some other embodiments, a plasma assisted chemical vapor deposition (PACVD) is used to enhance the rate of deposition of the layer, effectively allowing approximately 25.4 micron-meters of diamond like carbon coating to be applied, if not more. Though unusually thick, the relatively higher friction and lower adhesion of such diamond like carbon coatings can be an issue.

In other embodiments, processes are used with alloys of the Cu—Ni—Sn family. Such a prior art configuration is presented in relation to FIG. 2. Cu—Ni—Sn couplings are simply machined from wrought products, and due to the inherent low friction of the Cu—Ni—Sn alloys, have been associated to reduced power losses, therefore improved pumping system efficiency. Due to high strength as well, Cu—Ni—Sn couplings are also mechanical fatigue resistant, and when used in moderately corrosive environments can remain resistant against corrosion as well.

There is a need for a coupling that fills the gap between the high cost and good performance offerings and the basic low-cost and common performance offerings.

There is a further need to prevent failures prevalent in artificial lift, including sucker rod pumps where power transmission and casing wear failure occur towards end-of-life.

There is a further need to provide an easily manufacturable set of components that improve artificial lift pump components, either in sucker rods, electric submersible pumps, or others. While there is a greater demand for improvements in suck-rod couplings, there are also other cylindrical components that may be considered as couplings. Couplings function as intermediate mechanical pieces that link directly or indirectly proper power transmission from one part of a pumping system to another. Among these are radial bearings, thrust bearings, bushing, spacers. All these components benefit from low friction surfaces, and can further benefit by having their surface as being hard and thick, a second attribute that promotes wear resistance. In summary, there are component needs for integrated processes with surface treatments and coatings to improve the performance of all these components. These integrated process solutions can involve preferably small interstitials atoms of carbon, nitrogen, and/or boron rich surfaces produced onto a variety of substrate materials. A diamond like carbon coating is one such example of coating solutions.

SUMMARY

So that the manner in which the above recited features of the present disclosure can be understood in detail, a more particular description of the disclosure, briefly summarized below, may be had by reference to embodiments, some of which are illustrated in the drawings. It is to be noted that the drawings illustrate only typical embodiments of this disclosure and are therefore not to be considered limiting of its scope, for the disclosure may admit to other equally effective embodiments without specific recitation. Accordingly, the following summary provides just a few aspects of the description and should not be used to limit the described embodiments to a single concept.

In one example embodiment, a method for producing a low-friction, wear, and fatigue resistant surface is disclosed. The method may comprise selecting a material for machining, the material forming an item for production and performing a nitrocarburizing or boronizing process to produce a case hardening on the item, optionally re-machining as needed by the initial shape of the material, performing a final grinding of the nitrocarburized or boronized material on the item, optionally straightening, and optionally re-heat treating before finally performing a process for producing an exterior coating on the item.

In another example embodiment, a component for an artificial lift pump system is disclosed. The component may comprise a body formed from a metallic material, typically ferrous and comprised of a carbon or low-alloy steel due to their low costs and excellent responses to nitrocarburizing or boronizing. The component may further comprise a first nitrocarburizing or boronized layer placed on an exterior surface of the material. The component may further comprise a second layer placed on the first nitrocarburizing or boronized layer. The first layer and the second layer are selected to be carbon-rich, nitrogen-rich, boron-rich, and combinations thereof. Unlike a conventional coating, the first layer is selected to be a surface treatment that would enrich the component in carbon-nitrogen-boron while not practically changing its dimensions as a coating would. The alloying of the material of the component by small atoms of carbon, nitrogen, or boron is also to improve the substrate material hardness and therefore ultimate strength, a beneficial property to promote good fatigue resistance in some applications.

In a further example embodiment, a component for a sucker pump system is disclosed. The component may comprise a body formed from a material, the body having an inner diameter and an outer diameter. The component may also comprise a first nitrocarburizing or boronizing layer placed on the outer diameter on an exterior surface of the material. The component may also comprise a second layer on the first nitrocarburized or boronized layer that may be made of diamond like carbon or carbides (e.g., TaC, TiC, WC-type, SIC), boron, boron nitride (BN) or transition-metal nitrides (e.g., TIN, VN, $Mo_2N$), carbonitrides (e.g. TiAlCN), and the like. The component may include threaded sections, grooves, slots, and may be used for direct attachment purposes or simply to space two moving parts critical to power transmission. The component may be subject to linearly displacements in the well, as a sucker rod coupling, or may be experiencing a rotative motion, as needed at surface, or within an electric submersible pump.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the drawings. It is to be noted, however, that the appended drawings illustrate only typical embodiments of this disclosure and are therefore not be considered limiting of its scope, for the disclosure may admit to other equally effective embodiments.

Figure 1:
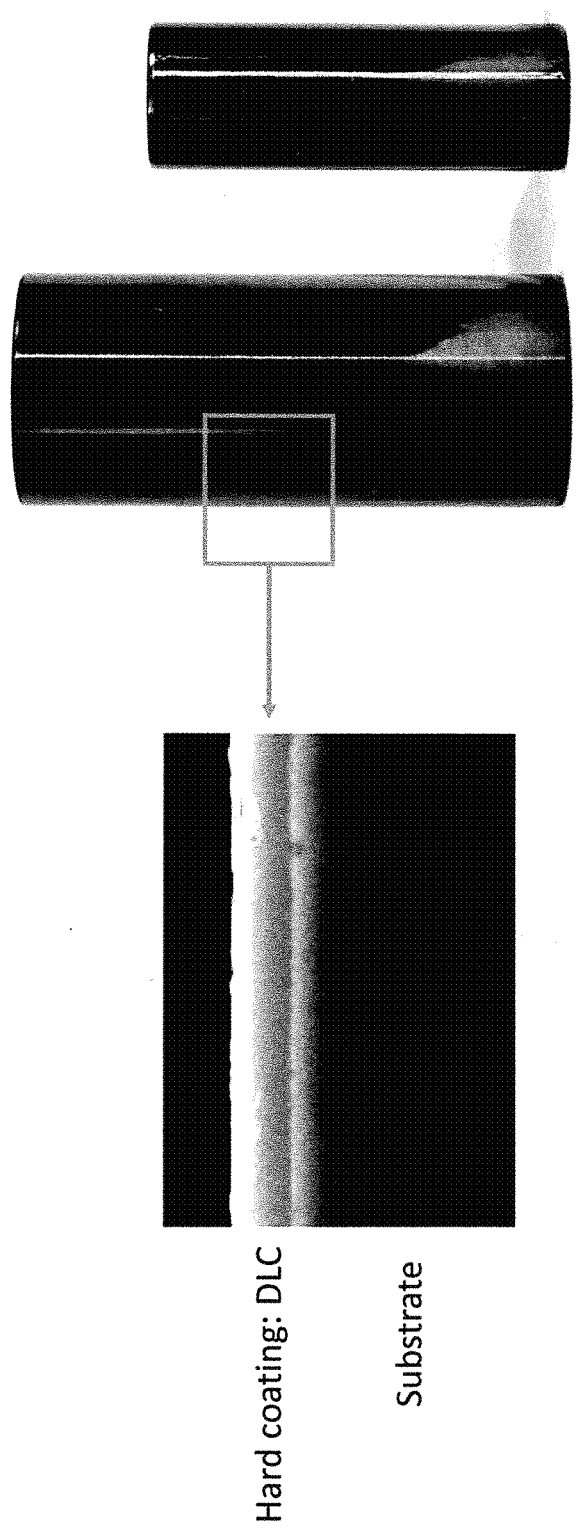
FIG. 1 is a prior art diamond like coating placed upon a typical cylindrical part referred as coupling.
Figure 2:
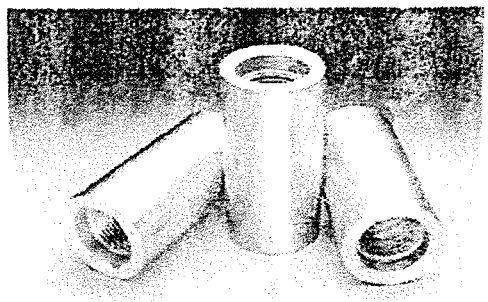
FIG. 2 is a prior a copper-nickel-tin coupling.

While the embodiments described herein are susceptible to various modifications and alternative forms, specific embodiments have been shown by way of example in the drawings and will be described in detail herein. The embodiments described herein are not intended, however, to be limited to the particular forms disclosed. Rather, the instant disclosure covers all modifications, equivalents, and alternatives falling within the scope of the appended claims.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the claims except where explicitly recited in a claim. Likewise, reference to "the disclosure" shall not be construed as a generalization of inventive subject matter disclosed herein and shall not be considered to be an element or limitation of the claims except where explicitly recited in a claim.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first", "second" and other numerical terms, when used herein, do not imply a sequence or order unless clearly indicated by the context. Thus, a first element, component, region, layer or section discussed herein could be termed a second element, component, region, layer or section without departing from the teachings of the example embodiments.

When an element or layer is referred to as being "on," "engaged to," "connected to," or "coupled to" another element or layer, it may be directly on, engaged to, connected to, coupled to the other element or layer, or interleaving elements or layers may be present. In contrast, when an element is referred to as being "directly on," "directly engaged to," "directly connected to," or "directly coupled to" another element or layer, there may be no interleaving elements or layers present. Other words used to describe the relationship between elements should be interpreted in a like fashion. As used herein, the term "and/or" includes any and all combinations of one or more of the associated listed terms.

In the following, when referring to a layer, a layer may have distinct boundaries, or alternatively be diffused. In a diffused boundary, the chemical composition is gradually changing, usually over an appreciable distance. For schematic purposes, all drawings show well-delineated layers.

In the following, when nitrocarburizing is referred to, it includes processes such as carburizing, nitriding, carburization, carbonitriding, case hardening, cementation, among others all aimed at enriching a surface and volume immediately under with carbon and/or nitrogen atoms. Similarly, when boronizing is referred to, it includes bonding or any other process in which boron is introduced to a metal or alloy surface, and volume immediately under.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art, that some embodiments may be practiced without many of these details, and that numerous variations or modifications from the described embodiments are possible. As used herein, the terms "above" and "below", "up" and "down", "upper" and "lower", "upwardly" and "downwardly", and other like terms indicating relative positions above or below a given point are used in this description to more clearly describe certain embodiments.

Aspects of the disclosure apply to an integrated surface treatment and coating applied to couplings to reduce friction and improve the life span of the couplings and related components during operation. The couplings are commonly made of ferrous alloys, such as carbon or low-alloy steels, but may also include non-ferrous alloys such as nickel, cobalt, titanium, among others. The first integrated case hardening on steel coupling is accomplished through a thermochemical approach, specifically nitrocarburizing or boronizing to form an integrated metallurgical transitional layer in the selected materials, and a second coating such as diamond like carbon coating, nitride, carbonitride, boride that is built upon the case hardening surface with a strong bonding by reacting with carbon, nitrogen, boron-rich compounds using chemical vapor deposition, physical vapor deposition, plasma assisted chemical vapor deposition, and related processes. The aspects presented have advantages of offering low-friction, thick and adherent hardened zones, and are cost competitive over current offerings in the market. Among carbides and nitrides to be formed onto a nitrided or carburized steel couplings are tantalum carbide (TaC), titanium carbide (TIC), tungsten carbide (WC-type), silicon carbide (SiC), titanium nitride (Till), vanadium nitride (VN), molybdenum nitride, ($Mo_2N$), titanium carbonitride (TiCN), titanium aluminum nitride (TiAlCN), aluminum titanium nitride (AlTiN), zirconium nitride (ZrN), chrome nitride (CrN). Among borides to be formed onto a boronized steel coupling are boron nitride (BN), boron carbide (BC).

In the aspects provided, an approach is proposed to fill the gap between the high cost and good performance offerings and basic low-cost and common performance offerings with at least two layers, one from a surface treatment introducing carbon, nitrogen, or boron by adsorption and diffusion, and another though a diamond like carbon, carbide, nitride, carbonitride, or boride coating adding approximately 25.4 micron-meters in thickness. Aspects of the disclosure includes a base diffusional case hardening for increased wear resistance, fatigue resistance, and a smooth thin top coating, with several advantages such as an adherence to hardened case, low friction, and intermediate cost.

The aspects described herein present a different method and arrangement compared to conventional technologies. The aspects described herein provide integrated surface treatments and coatings that are different from the multiple layer and low friction coatings provided in conventional apparatus that have a total of two types of layers, for example, an underlayer layer, and a top diamond like carbon coating, or repeated layers of diamond like carbon coating. In the aspects described herein, top layers are provided that allow for low friction surface as well as an economical cost of manufacturing the components. In the illustrated embodiments, the base nitrocarburized or boronized layer forms a metallurgical diffusion bond with the substrate material, and the second thin coating is integrated together with the first nitrocarburized or boronized layer to grow the effective hardened layer while offering added low friction. Further, nitrocarburizing and boronizing (also often referred as nitrocarburizing) are atomic diffusion processes, meaning that carbon atoms are transferred into a substrate from its surface, also practically unchanging its original dimensions. Differently, a coating is adding on top of a surface, not migrating into a material without significant dimensional change. Nitrocarburizing and boronizing are properly referred as a surface treatment or surface modification process, and not as a coating process. Surface treatments by atomic diffusion may be achieved by pack, gas, vacuum, liquid, plasma, all with the assistance of supplementary energy as provided by a furnace or plasma, including electrical source.

Figure 3:
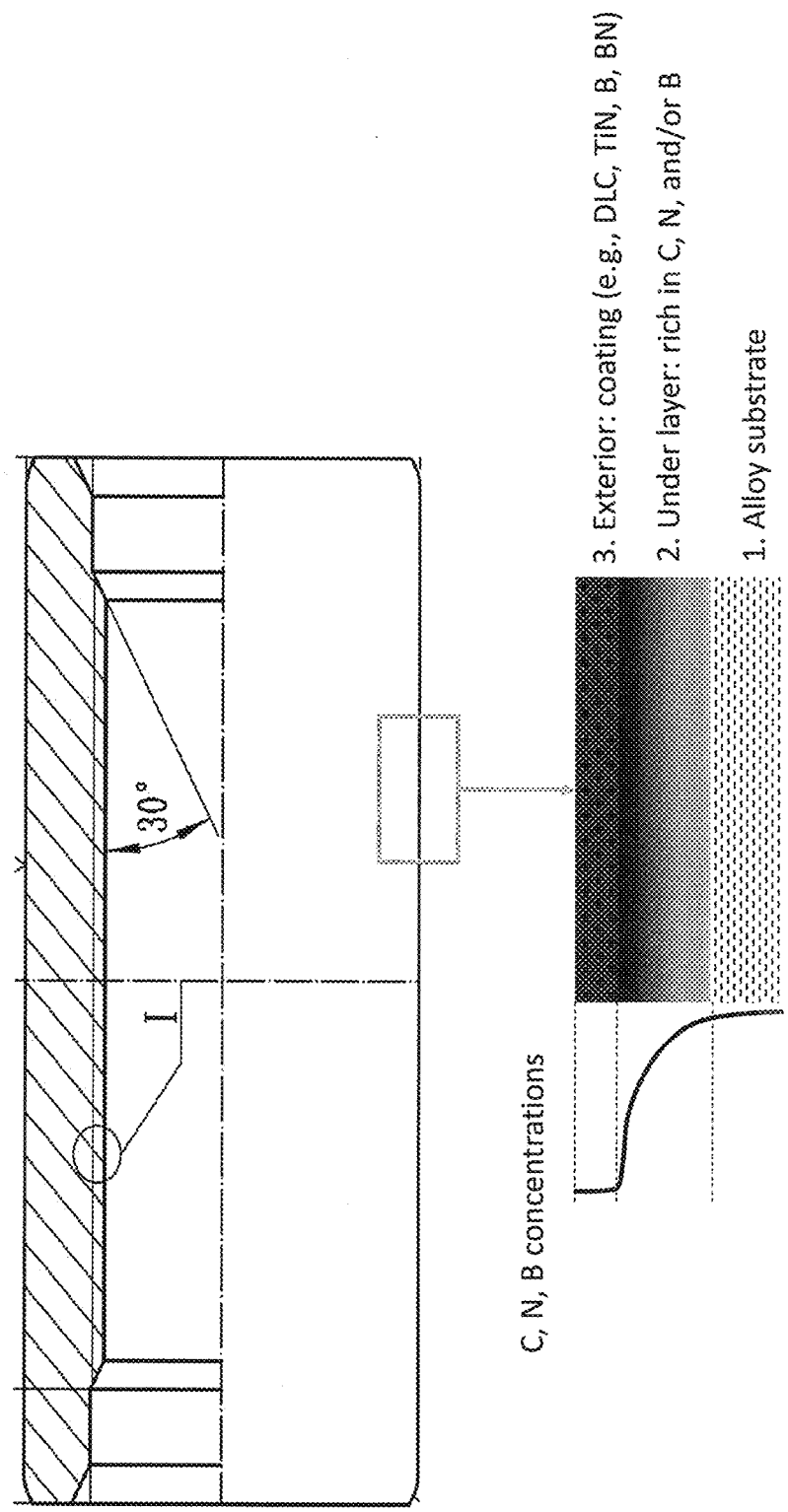
FIG. 3 is a side illustration of a steel coupling with a stacked steel matrix, nitrocarburizing or boronizing case and exterior coating such as diamond like carbon coating in accordance with one example embodiment of the disclosure.
Figure 4:
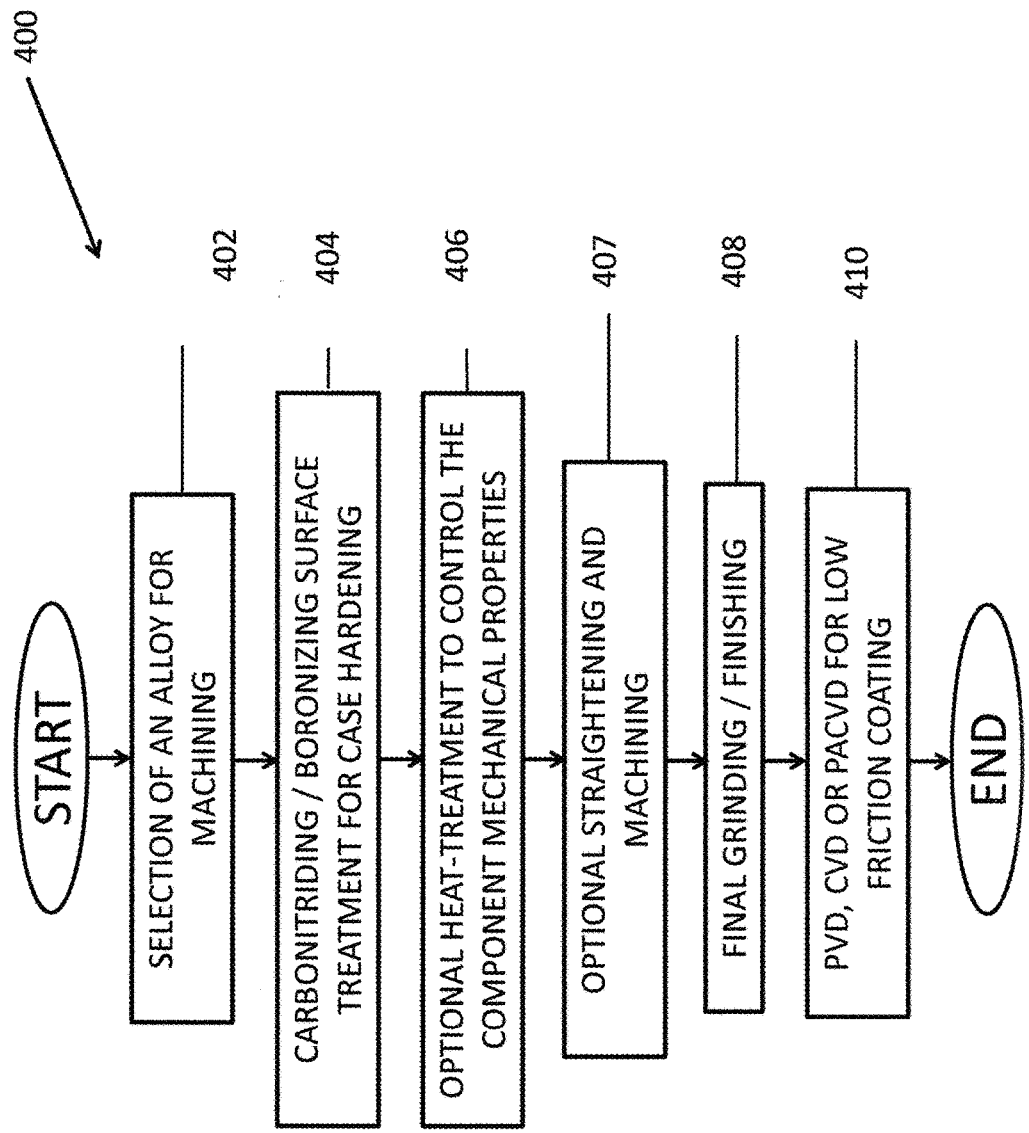
FIG. 4 is a method of producing a low-friction and thick wear resistant two-layer coating for a sucker rod pump component in accordance with an example embodiment of the disclosure.

Referring to FIG. 3, a side cross-sectional view of a steel coupling made with the process described in relation to FIG. 4, is illustrated. A steel coupling is presented that has two layers, for illustration purposes shown to be uniform even though the layer will typically exhibit a chemical gradient. Among the two layers, the top layer is used for reducing friction and thus offer major wear improvement by selecting it to be hard. As presented in FIG. 3, a substrate material is noted in level 1, or the base metal of the coupling. The base metal may be preferably a carbon or low-carbon content steel, for instance with less than approximately 0.4%. In other embodiments, different types of carbon steels, alloyed steels (9Cr-1 Mo, or UNS K90941), stainless steels (13Cr-type like UNS 541000, S42000), or corrosion resistant alloys (Ni—Cr—Mo alloys like UNS N07718, N07725, and titanium alloys like UNS 856400, among others) may be used. When using a corrosion resistant alloy such as a nickel alloy, diffusion processes that introduce nitrogen or boron are preferred because capable to create in-depth hardening. Carburizing is preferred for carbon and low-alloy steels.

Boronizing is overall less preferred because expensive, and accommodating less thin top coatings.

Aspects of the disclosure include components of a selected steel or alloy that support a carbon, nitrogen or boron enrichment thermal chemical processes, causing the base substrate to be nitrocarburized or boronized to a suitable depth, and this surface upon pre-finishing eventually receiving a low-friction and hard coating such as a diamond like coating, as shown in FIG. 3. The selected steel for coupling application, among others, should have a chemical composition with a carbon content up to approximately 0.4% (for example carbon steels, Cr—Ni—Mo low-alloy 4130, 4320, 8620 steel, 9310 steels or other low-carbon stainless steels). With typical carburizing process, the carbon-enrichment is typically accomplished in a carbon-rich environment at temperatures of 1550-1750 degrees F. for a soaking hour of less than 10 hours and can achieve a case depth of 0.005-0.060 inches. With some nitriding processes, a nitrogen rich layer may be built at temperatures of about 950 to 1200° F. for a soaking time of 2 to 24 hours to achieve case depth of 0.001-0.005 inches. This nitrocarburizing treatment, when performed at temperatures that measurably affect initial substrate mechanical properties, may then be followed by a solution treatment and a temper heat treatment at for mechanical property controls. The top coating is applied on the nitrocarburizing or boronized layer to form a low-friction and hard smooth top surface with a thickness of up to 0.001 inches (2-25 micron-meters). Processes in use may include chemical vapor deposition (CVD), physical vapor deposition (PVD), plasma assisted chemical vapor deposition (PACVD), and the likes.

In the illustrated embodiment, a material is presented with an outside surface and an inside surface. As will be understood, different types of configurations may be used, including pull tube guide arrangements, barrel, and valve rod guide configurations. The configuration presented in relation to FIG. 3, therefore, should not be considered limiting.

Referring to FIG. 4, a method 400 for producing a low-friction, hard and wear resistant two layer coating is disclosed. The method 400 may comprise, at 402 selecting a material for machining, the material forming an item for production. The method may continue, at 404, by performing a nitrocarburizing or boronizing process to produce a case-hardened layer on the item. The method may continue, at 406, by performing an optional heat treatment for carbon or alloy steels to control the desired part mechanical properties. The method may continue, at 408, by performing a final grinding of the nitrocarburized or boronized material on the item, with in between a potential straightening and additional machining as may be required by long and narrow components. The method may also continue, at 410, of performing a process for producing an exterior coating on the item. This process, at 410, may include performing a physical vapor deposition, a chemical vapor deposition, or plasma assisted chemical vapor deposition to produce a diamond like coating at selected areas. In some embodiments, the areas selected for deposition will be exterior surfaces only. In other embodiments, all areas capable of being reached by the deposition process will be used.

In embodiments where the diamond like coating is formed, processing may occur at a temperature below 1150 degrees F. to prevent affecting mechanical properties such as yield and tensile strengths during the processing step. Thicknesses of top exterior coating achieved during processing at 410 may be between 2.0 and 25.4 micron-meters in thickness.

The nitrocarburizing or boronizing process, at 404, may be used to increase a surface hardness of components being processed. In some embodiments, the surface hardness of the components being processed may be increased to over a value of 50 HRC (Rockwell hardness) over a depth of at least 0.001 inches. In other embodiments, the depth of the increase in Rockwell hardness may be as deep as 0.030 inches.

Figure 5:
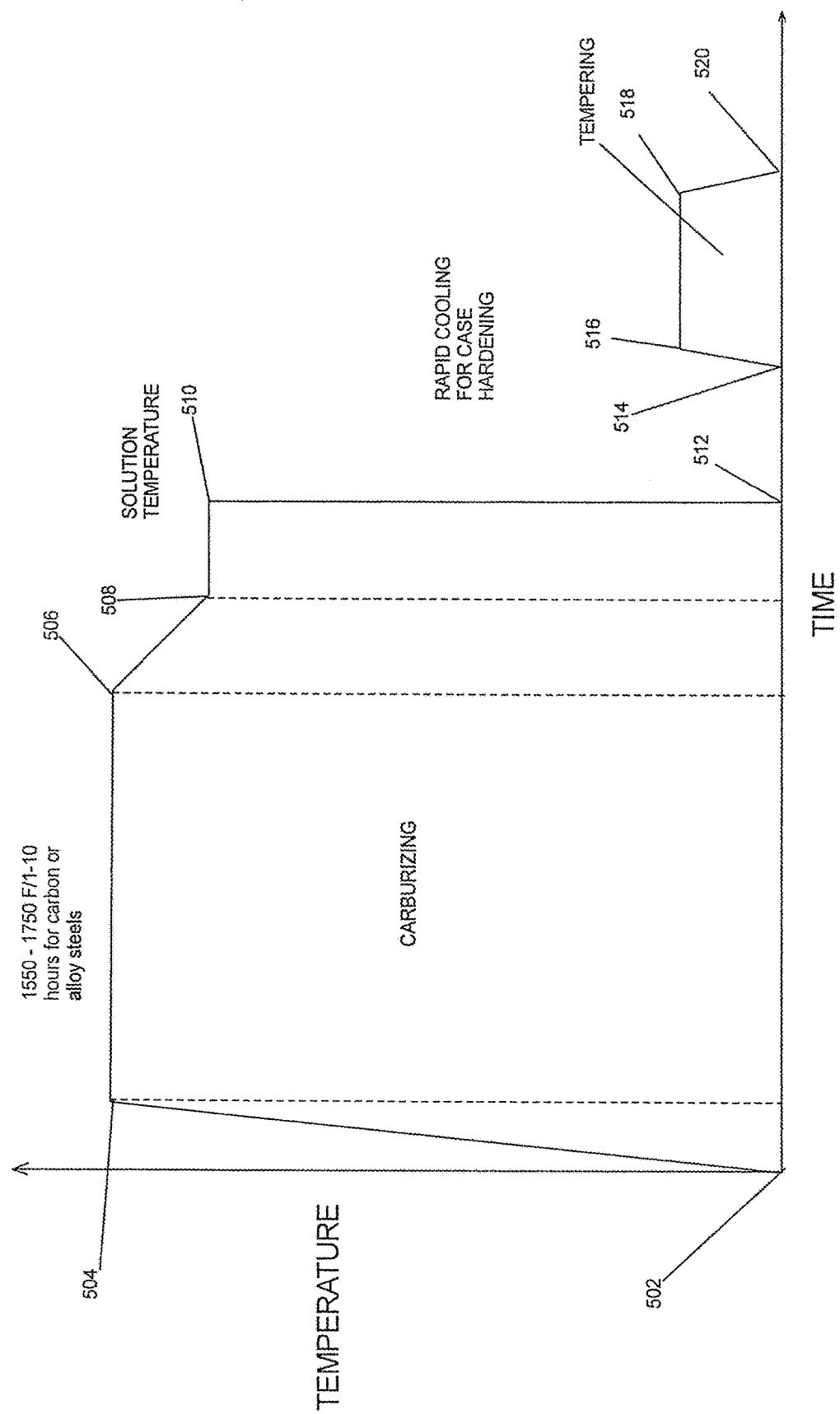
FIG. 5 is a graph of temperature vs. time of a nitrocarburizing and tempering process for production of a low-friction and wear resistant two-layer coating in accordance with an example embodiment of the disclosure.

Referring to FIG. 5, a temperature vs, time plot for processing of an item, as described in FIG. 4, is illustrated. At 502, the method starts with a temperature of zero and elapsed time of zero. A heating process is started, and a peak temperature is achieved at 504. The peak temperature is maintained, as illustrated, from 1 to 10 hours, providing a nitrocarburizing or boronizing process to point 506. The temperature is then reduced over a time from point 506 to 508, wherein a solution temperature (between 508 and 510) is reached. The temperature is then brought back down to zero at point 512. A further tempering process is then started at 514. A peak temperature is achieved at 516 and kept at this level until the desired tempering physical characteristics are achieved at 518. After the elapse of this amount of time, the temperature is then brought back to zero at 520, finishing the tempering process.

The aspects described above provide a steel coupling to fill the economic gap between the high cost and good performance offerings and basic low-cost and common performance offerings.

The described embodiments provide a cost of equipment that prevents failure mechanisms prevalent in artificial lift application, including casing wear and fatigue.

The described embodiments also provide an easily manufacturable set of components that is wear resistant for artificial-lift pump components.

In one example embodiment, a method for producing a low-friction and wear resistant two layer coating is disclosed. The method may comprise selecting a material for machining, the material forming an item for production, performing a nitrocarburizing or boronizing process to produce a case hardening on the item, performing a final grinding of the carburized material on the item preceding by optional straightening and additional machining, and performing a coating deposition process for producing an exterior coating on the item.

In another example embodiment, the method may be performed wherein the material for machining is a ferrous alloy, or steel.

In another example embodiment, the method may be performed wherein the material for machining is a non-ferrous alloy, among nickel alloys, cobalt alloys, titanium alloys.

In another example embodiment, the method may be performed wherein the process for producing the exterior coating on the item is a chemical vapor deposition.

In another example embodiment, the method may be performed wherein the process for producing the exterior coating on the item is a physical vapor deposition.

In another example embodiment, the method may be performed wherein the process for producing the exterior coating on the item is a plasma activated chemical vapor deposition.

In another example embodiment, the method may be performed wherein the process for producing the component includes a heat-treatment after the exterior coating has been applied.

In another example embodiment, the method may be performed wherein the nitrocarburizing or boronizing is performed in one, of a liquid, gas, pack, vacuum, plasma environment.

In another example embodiment, the method may be performed wherein the nitrocarburizing or boronizing process is a plasma assisted process.

In another example embodiment, a component for an artificial lift pump system is disclosed. The component may comprise a body formed from a material. The component may further comprise a first carbon, nitrogen, and/or boron layer introduced from the exterior surface of the material with case depth in excess of 25.4 micron-meters and a second layer placed on the first layer that is equal or less than 25.4 micron-meters.

In another example embodiment, the component may be configured wherein the body is placed in a form of a coupling.

In another example embodiment, the component may be configured wherein the material is a ferrous alloy or steel.

In another example embodiment, the component may be configured wherein the material is non-ferrous alloy, among nickel alloys, cobalt alloys, titanium alloys.

In another example embodiment, the component may be configured wherein the body is one of a pull tube guide, barrel, and a valve rod guide.

In another example embodiment, the component is one of a bushing, bearing, or spacer.

In another example embodiment, the component may be configured wherein the second layer is between 2.0 and 25.4 micron-meters in thickness.

In another example embodiment, the component may be configured wherein the material is less than 0.4% carbon content.

A component for a sucker pump system, comprising: a body formed from a material, the body having an inner diameter and an outer diameter; a first carburizing layer placed on the outer diameter on an exterior surface of the material; and a second layer made of a diamond like coating placed on the first carburizing layer.

In another example embodiment, the component may be configured wherein the second layer is between 2.0 and 25.4 micron-meters in thickness.

In another example embodiment, the component may be configured wherein the material has carbon content of less than 0.4 percent.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the present systems and methods and theft practical applications, to thereby enable others skilled in the art to best utilize the present systems and methods and various embodiments with various modifications as may be suited to the particular use contemplated.

What is claimed is:

1. A component for an artificial lift pump system, comprising:
    a body formed from a material;
    a first carbon, nitrogen, and/or boron layer introduced from the exterior surface of the material with case depth in excess of 25.4 micron-meters, wherein the first layer incorporates tantalum; and
    a second layer placed on the first layer that is equal or less than 25.4 micron-meters.

2. The component according to claim 1, wherein the body is placed in a form of a coupling.

3. The component according to claim 1, wherein the material is a ferrous alloy or steel.

4. The component according to claim 1, wherein the material is one of a non-ferrous alloy, among nickel alloys, cobalt alloys, titanium alloys.

5. The component according to claim 1, wherein the body is one of a pull tube guide, barrel, and a valve rod guide.

6. The component according to claim 1, wherein the body is one of a bushing, bearing, and a spacer.

7. The component according to claim 3, wherein the material is steel with less than 0.4% carbon content.

8. A component for a sucker rod pump system, comprising:
    a body formed from a steel with less than 0.4% carbon, the body having an inner diameter and an outer diameter;
    a first carburized layer placed on the outer diameter on an exterior surface of the steel, wherein the first layer incorporates tantalum; and
    a second layer made of a diamond like coating placed on the first carburized layer.

9. The component according to claim 8 wherein the second layer is between 2.0 and 25.4 micron-meters in thickness.

* * * * *